United States Patent [19]

Matsuda et al.

[11] Patent Number: 4,631,504
[45] Date of Patent: Dec. 23, 1986

[54] IMPEDANCE CONVERSION TRANSFORMER

[75] Inventors: Takeshi Matsuda; Harumi Kano, both of Tokyo, Japan

[73] Assignee: Showa Musen Kogyo Kabushiki Kaisha, Tokyo, Japan

[21] Appl. No.: 673,409

[22] Filed: Nov. 20, 1984

[30] Foreign Application Priority Data

May 28, 1984 [JP] Japan ................................. 59-106405

[51] Int. Cl.⁴ ............................................. H01P 5/10
[52] U.S. Cl. ......................................... 333/25; 333/32
[58] Field of Search .............................. 333/25, 26, 32; 336/180, 186, 182, 220, 860, 862, 859; 343/820, 222

[56] References Cited

U.S. PATENT DOCUMENTS

| | | | |
|---|---|---|---|
| 3,066,266 | 11/1962 | Fisher | 333/25 |
| 3,114,120 | 12/1963 | Heck | 333/25 |
| 3,428,886 | 2/1969 | Kawashima et al. | 333/26 X |
| 3,731,238 | 5/1973 | Jones et al. | 333/26 |
| 4,121,180 | 10/1978 | Greenway | 333/25 X |

FOREIGN PATENT DOCUMENTS

| | | | |
|---|---|---|---|
| 482537 | 5/1971 | Japan . | |
| 54-175588 | 6/1978 | Japan . | |
| 0824353 | 4/1981 | U.S.S.R. | 333/113 |

*Primary Examiner*—Eugene R. LaRoche
*Assistant Examiner*—Benny Lee
*Attorney, Agent, or Firm*—Oblon, Fisher, Spivak, McClelland, & Maier

[57] ABSTRACT

An impedance conversion transformer which comprises a ferrite core and a pair of coils wound about the ferrite core. The ferrite core has permittivity which reduces in proportion to increase in frequency within a band used and the pair of coils are wound in a bifilar arrangement so that the electric length of the coils becomes half-wave length. One of the coils has the opposite terminals electrically connected to each other and grounded and impedance variation and balanced to unbalanced conversion are achieved between the opposite terminals of the other coil.

1 Claim, 13 Drawing Figures

FIG. 1
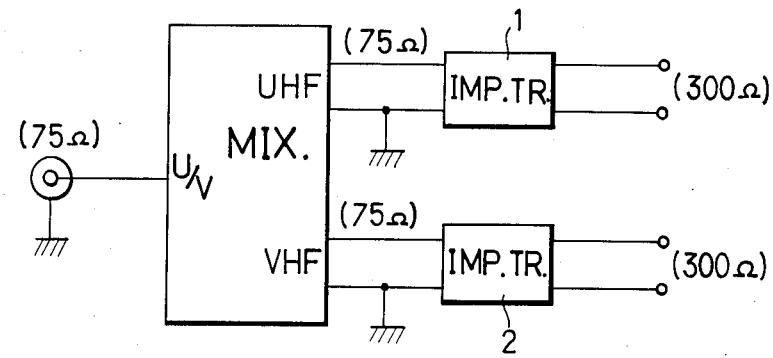
FIG. 2 PRIOR ART    FIG. 3 PRIOR ART
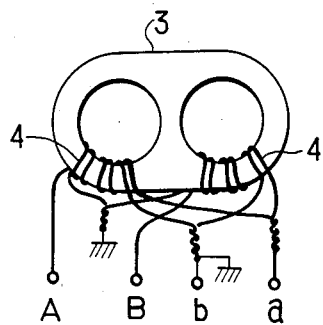 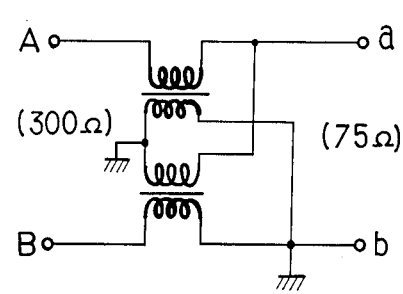
FIG. 4 PRIOR ART    FIG. 5 PRIOR ART
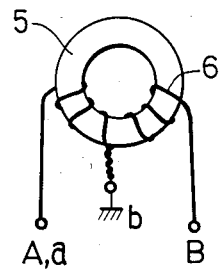 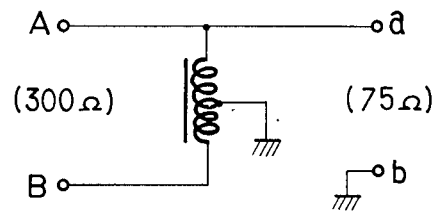

FIG. 6
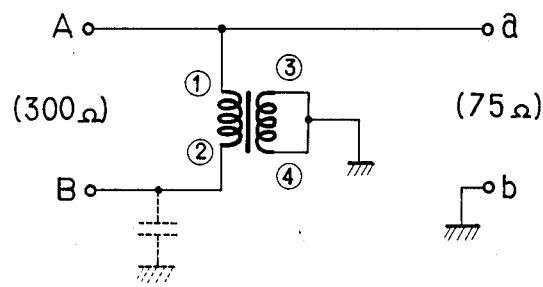
FIG. 7
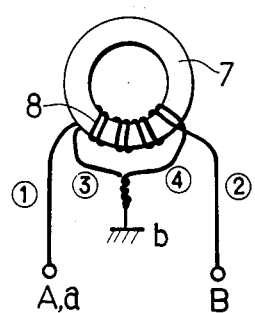
FIG. 8
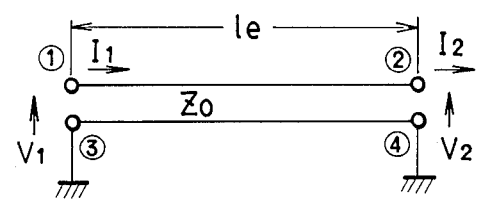
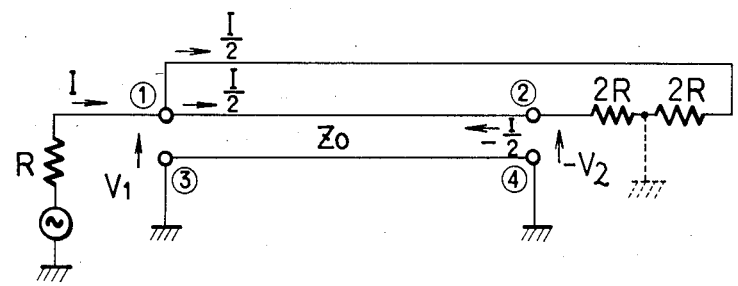
FIG. 9

IMPEDANCE CONVERSION TRANSFORMER

BACKGROUND OF THE INVENTION

1. Field of the Invention

This invention relates to an impedance conversion transformer suitably employed in mixers, branching filters and matching devices associated with television antennas.

2. Discussion of the Background

In mixers, branching filters and matching devices associated with television antennas and having input and output terminals of 300 ohms, an impedance conversion transformer is employed for realizing matching between a television receiver having a coaxial cable of 75 ohms or input and output terminals of 75 ohms, a video tape recorder and parallel line feeders of 300 ohms. FIG. 1 shows one type of mixer in a block diagram. In the mixer, VHF and UHF terminals to which parallel line feeders of 300 ohms are connected are electrically connected to the tuner of an unbalanced television circuit or video tape recorder of 75 ohms through impedance conversion transformers 1 and 2, respectively.

The transformers 1 and 2, as shown in FIG. 2, are called "four-terminal balun" in the art and are used as impedance conversion transformers. The four-terminal balun comprises a pair of coils 4 wound about the walls which define two spaced holes in a spectacle-shaped core 3 and the coils are arranged in the circuit as shown in FIG. 3. The prior art such as shown in FIGS. 2 and 3, has been detailed in Unexamined Japanese Model Appln. Gazette No. 175588/1979. Although the four-terminal balun exhibits excellent characteristics even in UHF band, since the core has the spectacle shape, the size of the balun can not be reduced substantially. Furthermore the winding of the coils is also troublesome in the four-terminal balun.

In addition to the four-terminal balun type impedance conversion transformer, there is the transformer as shown in FIG. 4, which is called in the art "three-terminal balun". The three-terminal balun comprises a coil 6 wound about a toroidal core 5 with an intermediate tap b extending from an intermediate position between the opposite ends of the coil (A, a and B) and the coil is arranged in the electrical circuit as shown in FIG. 5. The prior art such as shown in FIGS. 4 and 5, is detailed in Unexamined Japanese Utility Model Appln. Gazette No. 2537/1973. The three-terminal balun can be produced having a substantially small size. Although the three-terminal balun exhibits excellent characteristics in VHF band, the balun can not exhibit practical characteristics in UHF band.

SUMMARY OF THE INVENTION

The present invention has been developed with the drawbacks inherent in the conventional impedance conversion transformers referred to hereinabove in mind. The purpose of the present invention is to provide an impedance conversion transformer which exhibits characteristics superior to those provided by the above-mentioned four-terminal balun even in the UHF band and which is as small and simple as the three-terminal balun referred to hereinabove.

In order to achieve the purpose, according to the present invention, the impedance conversion transformer comprises a ferrite core the permeability of which reduces in proportion to increease in frequency within the frequency band used and a pair of coils wound in a bifilar arrangement so that electric length of the coils becomes half wave length for each frequency within the band used. One of the coils has the opposite terminals electrically connected to each other and grounded so that the transformer serves as a distributed parameter circuit having impedance variation and balance to unbalance conversion realized between the opposite terminals and one of the terminals and the ground of the other coil, whereby the impedance conversion transformer exhibits characteristics equivalent or superior to those by the four-terminal balun although the instant impedance transformer has the same size and simple winding as those of the three-terminal balun.

According to the present invention, there has been provided an impedance conversion transformer which comprises a ferrite core the permeability of which reduces in proportion to increase in frequency in a frequency band used and a pair of coils wound about the ferrite core in a bifilar arrangement in such a manner that the electric length of the coils becomes half-wave length for each frequency within the band used and in which one of the coils has the opposite terminals electrically connected to each other and grounded and impedance conversion and balanced to unbalanced conversion are achieved between the opposite terminals of the other coil.

The above and other objects and attendant advantages of the present invention will be more readily apparent to those skilled in the art from a reading of the following detailed description in conjunction with the accompanying drawings which show one preferred embodiment of the invention for illustration purpose only, but not for limiting the scope of the same in any way.

BRIEF DESCRIPTION OF THE DRAWINGS

FIG. 1 is a block diagram of a television antenna mixer in which the instant impedance conversion transformer can be effectively employed;

FIG. 2 is a plan view of a conventional four-terminal balun;

FIG. 3 is a view of the electrical connection of the balun of FIG. 2;

FIG. 4 is a plan view of a conventional three-terminal balun;

FIG. 5 is a view of the electrical connection of the balun of FIG. 4;

FIG. 6 is a view of the electrical connection of one embodiment of the impedance conversion transformer constructed in accordance with the present invention;

FIG. 7 is a plan view of the one embodiment of the impedance conversion transformer according to the present invention;

FIG. 8 is a view of the distributed parameter equivalent circuit of the embodiment as shown in FIG. 7;

FIG. 9 is a view of an electrical circuit showing 1:4 unbalanced to balanced impedance conversion operation by the embodiment of FIG. 7;

PREFERRED EMBODIMENT OF THE INVENTION

Figure 11A:
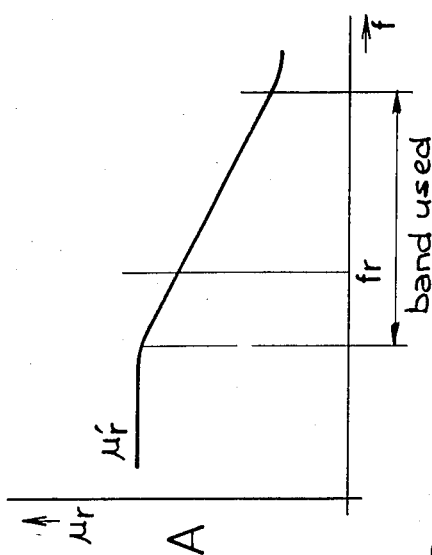
FIG. 11 is a graph showing the relationship between frequency characteristics of permeabilities of ferrite cores and electric lengths of coils.

The present invention will be now described referring to the accompanying drawings and more particularly, to FIG. 7 thereof in which one embodiment of the impedance conversion transformer constructed in accordance with the present invention is shown in a plan view. In this Figure, reference numeral 7 denotes a toroidal ferrite core having specific permeability which reduces in proportion to increase in frequency in the UHF band within the range of 450 MHZ–900 MHz. Reference numeral 8 denotes a coil assembly which comprises two polyurethane coated wires wound about the bifilar and electrically connected to each other in the electrical circuit as shown in FIG. 6. That is, the opposite terminals (3) and (4) of the first wire are electrically connected to each other and grounded and the opposite terminals (1) and (2) of the second wire serve as the terminals for balanced 300 ohms whereas the terminal (1) and ground serve as the terminals for unbalanced 75 ohms.

FIG. 8 is the distributed parameter equivalent circuit in the transformer as shown in FIG. 7. In the circuit of FIG. 8, when line loss is disregarded, the following equation is established:

$$\begin{pmatrix} V_1 \\ I_1 \end{pmatrix} = \begin{pmatrix} \cos\beta le & jZ_0 \sin\beta le \\ j\frac{1}{Z_0}\sin\beta le & \cos\beta le \end{pmatrix} \begin{pmatrix} V_2 \\ I_2 \end{pmatrix}$$

where $I_1$ is the input current and $I_2$ is the output current, $V_1$ is the input voltage and $V_2$ the output voltage wherein le is electric length of the coil assembly 8, $\beta$ is phase constant and $Z_0$ is characteristic impedance. When the above-mentioned characteristic impedance $Z_0$ is interposed between the terminals (2) and (4) in the coil assembly 8, impedance Z interposed between the terminals (1) and (3) becomes $Z_0$ as is clear from the following equation:

$$Z = \frac{V_1}{I_1} = \frac{(\cos\beta le + j\sin\beta le)V_2}{\left(j\frac{1}{Z_0}\sin\beta le + \frac{1}{Z_0}\cos\beta le\right)V_2} = Z_0$$

Thus, when the impedance interposed between the terminals (2) and (4) terminates at the characteristic impedance $Z_0$ and characteristic impedance $Z_0$ is interposed between the terminals (1) and (3), the impedance interposed between the terminals (1) and (3) becomes $Z_0/2$. Therefore, as shown in FIG. 9, in order to attain impedance matching by connecting a signal source having internal impedance of R between the terminals (1) and (3), from the equation $Z_0/2 = R$, it will be understood that impedance matching can be realized by connecting impedance of 2R ($=Z_0$) between the terminals (2) and (4) and between the terminals (1) and (3), respectively. When impedance of 2R ($=Z_0$) is interposed between the terminals (2) and (4), the relationship between $V_1$ and $V_2$ is expressed by the equation:

$$V_1 = (\cos\beta le + j\sin\beta le)V_2$$

Assuming that $\beta le = \pi$, that is, $le = \pi/\beta = \lambda/2$ then, $V_1 = -V_2$ thus, $V_1$ and $V_2$ are reverse in phase and even if impedance is interposed between the terminals (1) and (3) and between the terminals (2) and (4), respectively and the ground of the two impedances are made floating, the above-mentioned relationship is established and the circuit as shown in FIG. 9 can be supposed. This establishes a 1:4 unbalanced to balanced impedance conversion circuit.

In this case, effective power Pa of the signal source is:

$$Pa = V_1^2/R$$

and power P transmitted to load of 4R is:

$$P = \frac{|V_1 - V_2|^2}{4R} = \frac{(\cos\beta le - 1)^2 + \sin^2\beta le}{4R(\cos^2\beta le + \sin^2\beta le)} V_1^2$$

$$= \frac{(\cos\beta le - 1)^2 + \sin^2\beta le}{4R} V_1^2 = \frac{1 - \cos\beta le}{2R} V_1^2$$

and thus, transmission loss L is:

$$L = P/Pa = (1 - \cos\beta le)/2.$$

Figure 10:
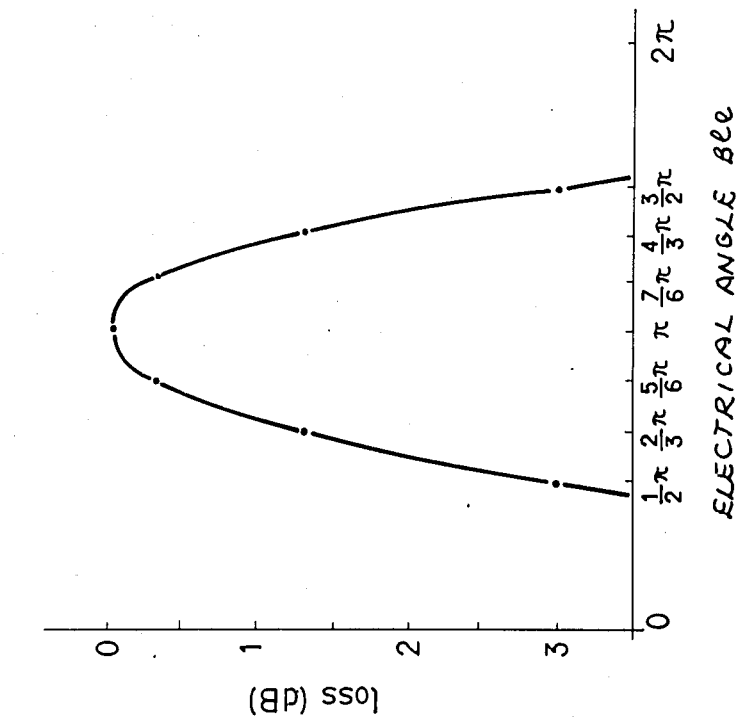
FIG. 10 is a graph showing transmission frequency characteristic.

FIG. 10 shows transmission frequency characteristic. By this characteristic, transmission loss in the UHF band within the range of 450 MHz–900 MHz, for example, can be suitably set by suitably selecting frequency $f_0$ so that the electric length le becomes $\lambda/2$. And as shown in FIG. 10, bandwidth of 3 dB provides 3 octave.

Figure 11B:
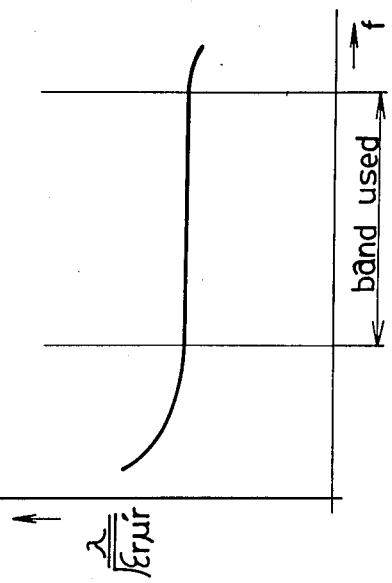
Figure 12:
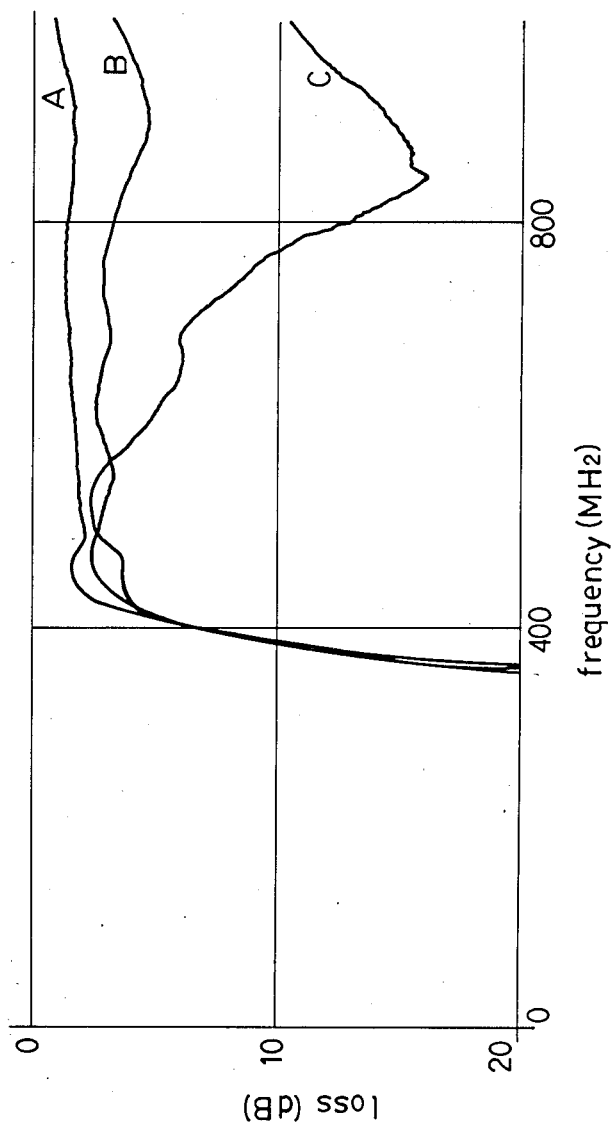
FIG. 12 is a graph showing loss characteristicss of the instant impedance conversion transformer and of the conventional 4- and 3-terminal baluns for comparison purpose when they are incorporated in a mixer.

In the impedance conversion transformer of the preset invention as shown in FIG. 7, since the coil assembly 8 is wound about the ferrite core 7, line loss can be further improved. And by the loading of the ferrite core 7, the wavelength shortening ratio will be $1/\sqrt{\varepsilon r \mu r'}$ and the winding length (physical length) l of the line of the coil 8 can be substantially shortened to a length less than electric length le. In this case, $\varepsilon r$ is specific permeability, $\mu r'$ is real number of specific permeability. As the material of the ferrite core 7, when a material the specific permeability $\mu r'$ of which reduces in proportion to increase in frequency in the frequency band used as shown by the Curve in FIG. 11A is selected, the above-mentioned wavelength shortening ratio increases as frequency increases and the term $\lambda/\sqrt{\varepsilon r \mu r'}$ in the frequency band used is maintained at a predetermined value as shown by the Curve in FIG. 11b and from the relationship $le = l\sqrt{\varepsilon r \mu r'} = \lambda/2$, electric length le can be made to be a length of $\lambda/2$ or a value approximate thereto in each frequency. Generally, the above-mentioned reltionship can be achieved by approaching natural magnetic resonance frequency of ferrite to frequency used whereby transmission loss can be reduced over a wide band. FIG. 12 shows transmission losses of the mixer as shown in FIG. 1 when the mixer has incorporated therein the instant impedance transformer a four-terminal balun and a three-terminal balun, respectively and in this Figure, Curve A is improved transmission loss by the use of the instant impedance conversion transformer, Curve B is transmission loss by the use of the four-terminal balun and Curve C is transmission loss by the use of the three-terminal balun.

And as shown in FIG. 6, when a capacitor on the order of 2 pF is connected to the terminal (2), impedance matching is achieved between the terminals (2) and (4) and voltage standing wave ratio (VSWR) and loss characteristic can also be improved.

With the above-mentioned arrangement of the components in the impedance conversion tranformer according to the present invention, loss characteristic is improved over a full UHF band and flat loss characteristic can be obtained without degradation of VSWR. In the impedance conversion transformer, winding of the coil assembly is easier than that of the coils in the conventional four- and three-baluns. By the loading of the ferrite core, necessary electric length can be obtained even when wire length of the coil assembly is made short whereby the size of the impedance conversion transformer can be reduced. And by selecting a suitable frequency characteristic for the permeability of the ferrite core, an impedance conversion transformer which exhibits uniform loss characteristic over a wide band can be obtained. Furthermore, since the ferrite core and other parts may be those employed in the conventional 3-terminal balun, the impedance conversion transformer of the invention can be produced at less expense.

Thus, in mixers, branching filters and the like associated with television antennas, when the instant impedance conversion transformer is employed in association with UHF terminal and a conventional three-terminal balun is employed in association with VHF terminal, small size mixers and branching filters having quite excellent loss characteristic can be produced at less expense.

While only one embodiment of the invention has been shown and described in detail, it will be understood that the same is for illustration purpose only and not to be taken as a definition of the invention, reference being had for this purpose to the appended claim.

What is claimed is:

1. An impedance conversion transformer comprising:
   a ferrite core having a permeability which reduces in proportion to an increase in frequency within a frequency band used; and
   a pair of coils wound about said ferrite core in a bifilar arrangement so that the electric length of each of said coils is a half-wave length for each frequency within said band used, with one of said coils having the opposite terminals thereof being electrically connected to each other and grounded and with the impedance conversion and balanced to unbalanced conversion being achieved between the opposite terminals of the other coil.

* * * * *